(12) United States Patent
Chang et al.

(10) Patent No.: US 7,264,846 B2
(45) Date of Patent: *Sep. 4, 2007

(54) RUTHENIUM LAYER FORMATION FOR COPPER FILM DEPOSITION

(75) Inventors: Mei Chang, Saratoga, CA (US); Seshadri Ganguli, Sunnyvale, CA (US); Nirmalya Maity, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 624 days.

This patent is subject to a terminal disclaimer.

(21) Appl. No.: 10/634,662

(22) Filed: Aug. 4, 2003

(65) Prior Publication Data

US 2004/0105934 A1 Jun. 3, 2004

Related U.S. Application Data

(63) Continuation-in-part of application No. 10/443,648, filed on May 22, 2003.

(60) Provisional application No. 60/385,499, filed on Jun. 4, 2002.

(51) Int. Cl.
*C23C 16/00* (2006.01)

(52) U.S. Cl. .............. 427/248.1; 427/255.23; 427/255.7

(58) Field of Classification Search ............. 427/248.1, 427/255.23, 255.7
See application file for complete search history.

(56) References Cited

U.S. PATENT DOCUMENTS

| | | | |
|---|---|---|---|
| 5,372,849 A | 12/1994 | McCormick et al. | 427/253 |
| 5,962,716 A | 10/1999 | Uhlenbrock et al. | 556/16 |
| 6,063,705 A | 5/2000 | Vaartstra | 438/681 |
| 6,114,557 A | 9/2000 | Uhlenbrock et al. | |
| 6,203,613 B1 | 3/2001 | Gates et al. | 117/104 |
| 6,338,991 B1 | 1/2002 | Zhang et al. | |
| 6,346,477 B1 | 2/2002 | Kaloyeros et al. | 438/680 |
| 6,365,502 B1 | 4/2002 | Paranjpe et al. | 438/622 |
| 6,372,598 B2 | 4/2002 | Kang et al. | 438/399 |
| 6,423,619 B1 | 7/2002 | Grant et al. | 438/589 |
| 6,440,495 B1 | 8/2002 | Wade et al. | |
| 6,462,367 B2 | 10/2002 | Marsh et al. | 257/295 |
| 6,479,100 B2 | 11/2002 | Jin et al. | |

(Continued)

FOREIGN PATENT DOCUMENTS

EP 1 293 509 9/2002

(Continued)

OTHER PUBLICATIONS

International Search Report dated Jul. 29, 2005 regarding International Application No. PCT/US2005/010203.

(Continued)

*Primary Examiner*—Timothy Meeks
*Assistant Examiner*—Kelly M Stouffer
(74) *Attorney, Agent, or Firm*—Patterson & Sheridan, LLP

(57) ABSTRACT

A method of ruthenium layer formation for high aspect ratios, interconnect features is described. The ruthenium layer is formed using a cyclical deposition process. The cyclical deposition process comprises alternately adsorbing a ruthenium-containing precursor and a reducing gas on a substrate structure. The adsorbed ruthenium-containing precursor reacts with the adsorbed reducing gas to form the ruthenium layer on the substrate.

46 Claims, 5 Drawing Sheets

U.S. PATENT DOCUMENTS

| | | | |
|---|---|---|---|
| 6,482,740 B2 | 11/2002 | Soininen et al. | 438/686 |
| 6,517,616 B2 | 2/2003 | Marsh et al. | |
| 6,527,855 B2 * | 3/2003 | DelaRosa et al. | 117/89 |
| 6,536,602 B2 | 3/2003 | Ruescher et al. | |
| 6,541,067 B1 | 4/2003 | Marsh et al. | |
| 6,576,778 B1 | 6/2003 | Uhlenbrock et al. | |
| 6,580,111 B2 | 6/2003 | Kim et al. | 257/301 |
| 6,596,602 B2 | 7/2003 | Iizuka et al. | 438/396 |
| 6,597,029 B2 | 7/2003 | Kim et al. | 257/295 |
| 6,605,735 B2 * | 8/2003 | Kawano et al. | 556/136 |
| 6,610,568 B2 | 8/2003 | Marsh et al. | 438/250 |
| 6,617,634 B2 | 9/2003 | Marsh et al. | 257/300 |
| 6,627,995 B2 | 9/2003 | Paranjpe et al. | |
| 6,713,373 B1 | 3/2004 | Omstead | |
| 6,737,317 B2 | 5/2004 | Marsh et al. | |
| 6,743,739 B2 | 6/2004 | Shimamoto et al. | |
| 6,744,138 B2 | 6/2004 | Marsh | |
| 6,780,758 B1 | 8/2004 | Derderian et al. | |
| 6,790,773 B1 | 9/2004 | Drewery et al. | |
| 6,800,542 B2 | 10/2004 | Kim | |
| 6,800,937 B2 | 10/2004 | Marsh et al. | |
| 6,887,795 B2 | 5/2005 | Soininen et al. | |
| 2001/0006838 A1 | 7/2001 | Won et al. | |
| 2001/0054730 A1 | 12/2001 | Kim et al. | 257/301 |
| 2002/0000587 A1 | 1/2002 | Kim et al. | 257/295 |
| 2002/0004293 A1 | 1/2002 | Soininen et al. | 438/584 |
| 2002/0025627 A1 | 2/2002 | Marsh et al. | 438/250 |
| 2002/0028556 A1 | 3/2002 | Marsh et al. | 438/299 |
| 2002/0074577 A1 | 6/2002 | Marsh et al. | 257/250 |
| 2002/0076837 A1 | 6/2002 | Hujanen et al. | 438/3 |
| 2002/0076881 A1 | 6/2002 | Marsh et al. | 438/250 |
| 2002/0081381 A1 | 6/2002 | DelaRosa et al. | 427/255.28 |
| 2002/0102810 A1 | 8/2002 | Iizuka et al. | 438/396 |
| 2002/0121697 A1 | 9/2002 | Marsh | 257/751 |
| 2002/0125516 A1 | 9/2002 | Marsh et al. | 257/295 |
| 2002/0173054 A1 * | 11/2002 | Kim | 438/3 |
| 2003/0096468 A1 | 5/2003 | Soininen et al. | 438/200 |
| 2003/0165615 A1 | 9/2003 | Aaltonen et al. | 427/79 |
| 2003/0212285 A1 | 11/2003 | Uhlenbrock et al. | |
| 2004/0005753 A1 | 1/2004 | Kostamo et al. | |
| 2004/0038529 A1 | 2/2004 | Soininen et al. | |
| 2004/0105934 A1 | 6/2004 | Chang et al. | |
| 2004/0241321 A1 | 12/2004 | Ganguli et al. | |
| 2005/0006799 A1 | 1/2005 | Gregg et al. | |
| 2005/0081882 A1 | 4/2005 | Greer et al. | |

FOREIGN PATENT DOCUMENTS

| | | |
|---|---|---|
| JP | 2001-111000 | 4/2001 |
| JP | 2001-237400 | 8/2001 |
| WO | 01/88972 | 11/2001 |
| WO | 02/45167 | 6/2002 |
| WO | WO 03/056612 | 7/2003 |
| WO | WO 2005/020317 | 3/2005 |

OTHER PUBLICATIONS

Meda, et al. "Chemical Vapor Deposition of Ruthenium Dioxide Thin Films From (Bis(2, 4-dimethylpentadienyl) Ruthenium," Chemical Aspects of Electronic Ceramics Processing, Symposium Mater. Res. Soc., Warrendale, PA, USA, 1998, pp. 75-80, XP009050315, ISBN: 1-55899-400-9.

International Search Report dated Mar. 11, 2005 regarding International Application No. PCT/US2004/024805.

Aaltonen, et al., "Atomic Layer Deposition of Ruthenium from $RuCp_2$ and Oxygen: Film Growth and Reaction Mechanism Studies," Electrochemical Society Proceedings vol. 2003-08 pp. 946-953.

Aaltonen, et al., "Atomic Layer Deposition of Ruthenium Thin Films from $Ru(thd)_3$ and Oxygen," Chem. Vap. Deposition (2004), 10, No. 4 pp. 215-219.

Aaltonen, et al., "Ruthenium Thin Films Grown by Atomic Layer Deposition," Chem. Vap. Deposition (2003), 9, No. 1 pp. 45-49.

Aoyama, et al.; "Ruthenium Films Prepared by Liquid Source Chemical Vapor Deposition Using Bis-(ethylcyclopentadienyl)ruthenium," Jpn. J. Appl. Phys. vol. 38 (1999) pp. L1134-L1136.

Dadgar, et al., "Growth of Ru doped semi-insulating InP by low pressure metalorganic chemical vapor deposition," Journal of Crystal Growth 195 (1998) pp. 69-73.

Kwon, et al., "Atomic Layer Deposition of Ruthenium Thin Films for Copper Glue Layer," Journal of the Electrochemical Society, 151 (2) (2004) pp. G109-G112.

Kwon, et al., "Plasma-Enhanced Atomic Layer Deposition of Ruthenium Thin Films," Electrochemical and Solid-State Letters, 7 (4) (2004) pp. C46-C48.

Lashdaf, et al., "Deposition of palladium and ruthenium β-diketonates on alumina and silica supports in gas and liquid phase," Applied Catalysis A: General 241 (2003) pp. 51-63.

Lim, et al.,"Atomic layer deposition of transition metals," Nature Materials, vol. 2 Nov. (2003) pp. 749-754.

Shibutami, et al., "A Novel Ruthenium Precursor for MOCVD without Seed Ruthenium Layer," TOSOH Research & Technology Review, vol. 47 (2003) pp. 61-64.

* cited by examiner

RUTHENIUM LAYER FORMATION FOR COPPER FILM DEPOSITION

CROSS-REFERENCE TO RELATED APPLICATIONS

This application is a continuation-in-part of U.S. patent application Ser. No. 10/443,648, filed May 22, 2003, which claims benefit of U.S. Provisional Patent Application Ser. No. 60/385,499, filed Jun. 4, 2002, which is herein incorporated by reference.

BACKGROUND OF THE INVENTION

1. Field of the Invention

Embodiments of the present invention generally relate to a method of noble metal layer formation and, more particularly to methods of ruthenium layer formation for use in copper integration.

2. Description of the Related Art

Sub-quarter micron, multi-level metallization is one of the key technologies for the next generation of very large scale integration (VLSI) and ultra large scale integration (ULSI) semiconductor devices. The multilevel interconnects that lie at the heart of this technology require the filling of contacts, vias, lines, and other features formed in high aspect ratio apertures. Reliable formation of these features is very important to the success of both VLSI and ULSI as well as to the continued effort to increase client density and quality on individual substrates and die.

As circuit densities increase, the widths of contacts, vias, lines and other features, as well as the dielectric materials between them may decrease to less than about 250 nm, whereas the thickness of the dielectric layers remains substantially constant with the result that the aspect ratios for the features, i.e., their height divided by width, increases. Many conventional deposition processes have difficulty filling structures where the aspect ratio exceeds 6:1, and particularly where the aspect ratio exceeds 10:1. As such, there is a great amount of ongoing effort being directed at the formation of void-free, nanometer-sized structures having aspect ratios wherein the ratio of feature height to feature width can be 6:1 or higher.

Additionally, as the feature widths decrease, the device current typically remains constant or increases, which results in an increased current density for such feature. Elemental aluminum and aluminum alloys have been the traditional metals used to form vias and lines in semiconductor devices because aluminum has a perceived low electrical resistivity, superior adhesion to most dielectric materials, ease of patterning, and the ability to obtain aluminum in a highly pure form. However, aluminum has a higher electrical resistivity than other more conductive metals such as copper. Aluminum can also suffer from electromigration leading to the formation of voids in the conductor.

Copper and copper alloys have lower resistivities than aluminum, as well as a significantly higher electromigration resistance compared to aluminum. These characteristics are important for supporting the higher current densities experienced at high levels of integration and increased device speed. Copper also has good thermal conductivity. Therefore, copper is becoming a choice metal for filling sub-quarter micron, high aspect ratio interconnect features on semiconductor substrates.

A thin film of a noble metal such as, for example, palladium, platinum, cobalt, nickel and rhodium, among others may be used as an underlayer for the copper vias and lines. Such noble metals, which are resistant to corrosion and oxidation, may provide a smooth surface upon which a copper seed layer is subsequently deposited using for example, an electrochemical plating (ECP) process.

The noble metal is typically deposited using a chemical vapor deposition (CVD) process or a physical vapor deposition (PVD) process. Unfortunately, noble metals deposited on high aspect ratio interconnect features using CVD and/or PVD processes generally have poor step coverage (e.g., deposition of a non-continuous material layer). The poor step coverage for the noble metal material layer may cause the subsequent copper seed layer deposition using an ECP process to be non-uniform.

Therefore, a need exists in the art for a method of depositing noble metals in high aspect ratio interconnect features having good step coverage.

SUMMARY OF THE INVENTION

A method of noble metal layer formation for high aspect ratio interconnect features is described. The noble metal layer is formed using a cyclical deposition process, such as atomic layer deposition (ALD). The cyclical deposition process comprises alternately adsorbing a noble metal-containing precursor and a reducing gas on a substrate structure. The adsorbed noble metal-containing precursor reacts with the adsorbed reducing gas to form the noble metal layer on the substrate. Suitable noble metals may include, for example, ruthenium, palladium, platinum, cobalt, nickel and rhodium, among others.

The noble metal layer formation is compatible with integrated circuit fabrication processes. In one integrated circuit fabrication process, the noble metal layer may be used as an underlayer for a copper seed layer in a copper interconnect. For such an embodiment, a preferred process sequence includes providing a substrate having an interconnect pattern defined in one or more dielectric layers formed thereon. The interconnect pattern includes a barrier layer conformably deposited thereon. A noble metal layer (e.g., ruthenium) is conformably deposited on the barrier layer. The noble metal layer is deposited using a cyclical deposition process by alternately adsorbing a noble metal-containing layer and a reducing gas on the substrate. Thereafter, the copper interconnect is completed by depositing a copper seed layer on the noble metal layer and than filling the interconnects with bulk copper metal.

In one embodiment, a method of forming a film on a substrate comprises positioning the substrate within a process chamber and forming a ruthenium layer on at least a portion of the substrate by sequentially chemisorbing monolayers of a ruthenium-containing compound and a reducing gas on the substrate to form the ruthenium layer.

In another embodiment, a method of forming a ruthenium layer on a substrate for use in integrated circuit fabrication comprises positioning the substrate within a process chamber, wherein the process chamber is in fluid communication with a gas delivery system, delivering a ruthenium-containing compound from the gas delivery system to the process chamber, chemisorbing a ruthenium-containing layer on the substrate, delivering a reducing gas from the gas delivery system to the process chamber and reacting the reducing gas with the ruthenium-containing layer to form the ruthenium layer on the substrate.

In another embodiment, a method for forming a layer comprising ruthenium on a substrate surface, sequentially comprises: a) exposing the substrate surface to a ruthenium-containing compound to form a ruthenium-containing layer on the substrate surface; b) purging the chamber with a purge gas; c) reacting a reducing gas with the ruthenium-containing layer; and d) purging the chamber with the purge gas.

In another embodiment, a method of forming a ruthenium layer on a substrate comprises positioning the substrate within a process chamber and forming the ruthenium layer on at least a portion of the substrate by sequentially chemisorbing monolayers of a ruthenium-containing compound and a reducing gas. The method further includes that the process chamber comprises a substrate support having the substrate, a chamber lid comprising a passageway at a central portion of the chamber lid and comprising a bottom surface extending from the passageway to a peripheral portion of the chamber lid, the bottom surface shaped and sized to substantially cover the substrate, one or more valves coupled to the passageway, one or more gas sources coupled to each valve and a reaction zone defined between the chamber lid and the substrate, the reaction zone comprising a small volume.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
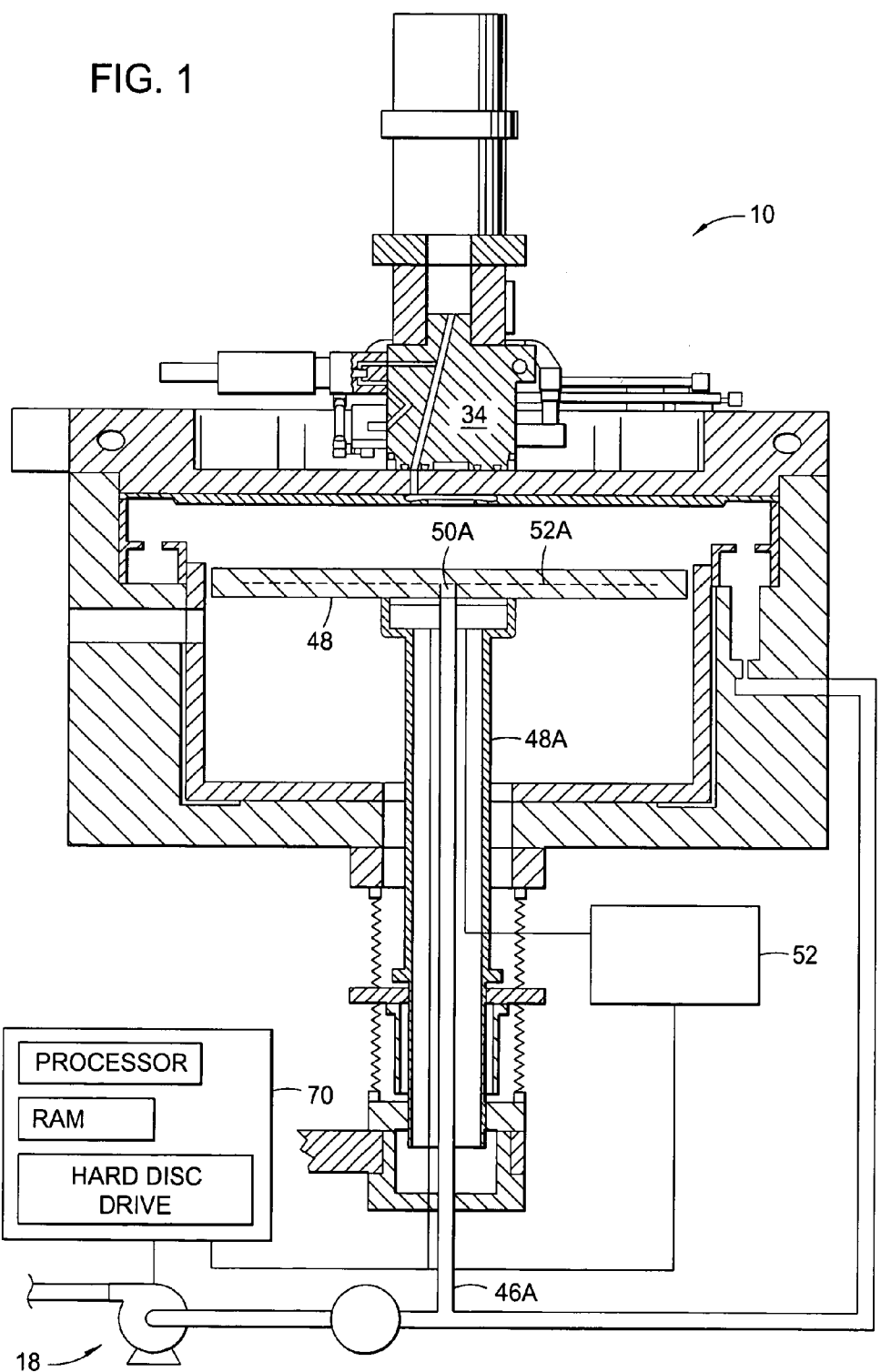
FIG. 1 depicts a schematic cross-sectional view of a process chamber that can be used to perform a cyclical deposition process described herein.

FIG. 1 depicts a schematic cross-sectional view of a process chamber 10 that can be used to perform integrated circuit fabrication in accordance with embodiments described herein. The process chamber 10 generally houses a substrate support pedestal 48, which is used to support a substrate (not shown). The substrate support pedestal 48 is movable in a vertical direction inside the process chamber 10 using a displacement mechanism 48A.

Depending on the specific process, the substrate can be heated to some desired temperature prior to or during deposition. For example, the substrate support pedestal 48 may be heated using an embedded heating element 52A. The substrate support pedestal 48 may be resistively heated by applying an electric current from an AC power supply 52 to the heating element 52A. The substrate (not shown) is, in turn, heated by the pedestal 48. Alternatively, the substrate support pedestal 48 may be heated using radiant heaters such as, for example, lamps (not shown).

A temperature sensor 50A, such as a thermocouple, is also embedded in the substrate support pedestal 48 to monitor the temperature of the pedestal 48 in a conventional manner. The measured temperature is used in a feedback loop to control the AC power supply 52 for the heating element 52A, such that the substrate temperature can be maintained or controlled at a desired temperature which is suitable for the particular process application.

A vacuum pump 18 and the conduit system 46A are used to evacuate the process chamber 10 and to maintain the pressure inside the process chamber 10. A gas manifold 34, through which process gases are introduced into the process chamber 10, is located above the substrate support pedestal 48. The gas manifold 34 is connected to a gas panel (not shown), which controls and supplies various process gases to the process chamber 10.

Proper control and regulation of the gas flows to the gas manifold 34 are performed by mass flow controllers (not shown) and a microprocessor controller 70. The gas manifold 34 allows process gases to be introduced and uniformly distributed in the process chamber 10. Additionally, the gas manifold 34 may optionally be heated to prevent condensation of any reactive gases within the manifold.

The gas manifold 34 includes a plurality of electronic control valves (not shown). The electronic control valves as used herein refer to any control valve capable of providing rapid and precise gas flow to the process chamber 10 with valve open and close cycles within a range from about 0.01 seconds to about 10 seconds, preferably from about 0.05 seconds to about 2 seconds and more preferably from about 0.1 seconds to about 1 second.

The microprocessor controller 70 may be one of any form of general purpose computer processor (CPU) that can be used in an industrial setting for controlling various chambers and sub-processors. The computer may use any suitable memory, such as random access memory, read only memory, floppy disk drive, compact disc drive, hard disk, or any other form of digital storage, local or remote. Various support circuits may be coupled to the CPU for supporting the processor in a conventional manner. Software routines as required, may be stored in the memory or executed by a second CPU that is remotely located.

The software routines are executed to initiate process recipes or sequences. The software routines, when executed, transform the general purpose computer into a specific process computer that controls the chamber operation so that a chamber process is performed. For example, software routines may be used to precisely control the activation of the electronic control valves for the execution of process sequences according to the present invention. Alternatively, the software routines may be performed in hardware, as an application specific integrated circuit or other type of hardware implementation, or a combination of software or hardware.

Figure 2:
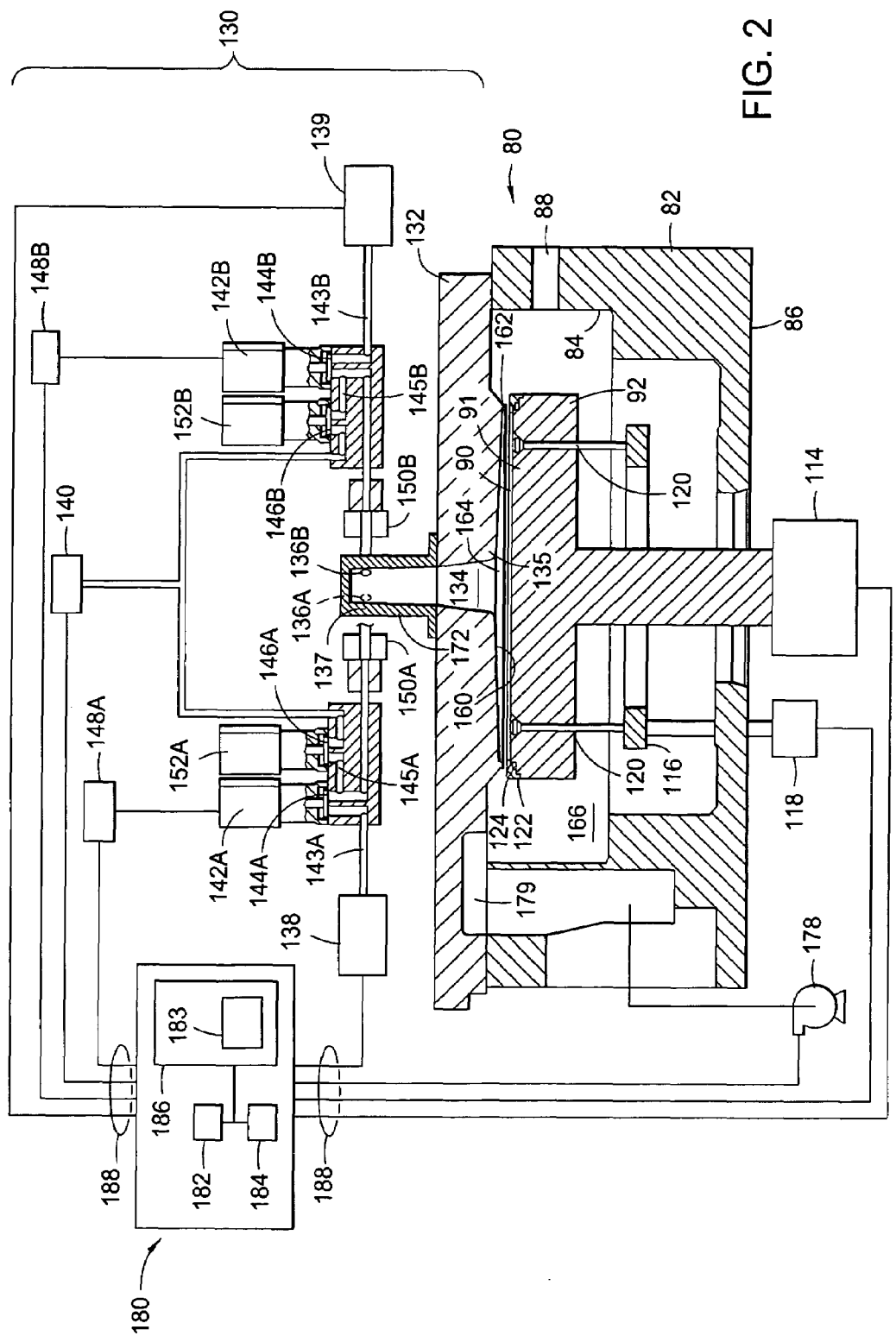
FIG. 2 depicts a schematic cross-sectional view of another process chamber that can be used to perform a cyclical deposition process described herein.

FIG. 2 is a schematic cross-sectional view of one embodiment of a chamber 80 including a gas delivery apparatus 130 adapted for cyclic deposition, such as atomic layer deposition or rapid chemical vapor deposition. A detailed description for a chamber 80 is described in commonly assigned U.S. Publication No. 20030079686, and issued as U.S. Pat. No. 6,916,398. and commonly assigned and co-pending U.S. Ser. No. 10/281,079, entitled "Gas Delivery Apparatus for Atomic Layer Deposition," filed Oct. 25, 2002, and published as U.S. 20030121608. which are both incorporated herein by reference in their entirety. The terms atomic layer deposition (ALD) and rapid chemical vapor deposition as used herein refer to the sequential introduction of reactants to deposit a thin layer over a substrate structure. The sequential introduction of reactants may be repeated to deposit a plurality of thin layers to form a conformal layer to a desired thickness. The chamber 80 may also be adapted for other deposition techniques.

The chamber 80 comprises a chamber body 82 having sidewalls 84 and a bottom 86. A slit valve 88 in the chamber 80 provides access for a robot (not shown) to deliver and retrieve a substrate 90, such as a 200 mm or 300 mm semiconductor wafer or a glass substrate, from the chamber 80.

A substrate support 92 supports the substrate 90 on a substrate receiving surface 91 in the chamber 80. The substrate support 92 is mounted to a lift motor 114 to raise and lower the substrate support 92 and a substrate 90 disposed thereon. A lift plate 116 connected to a lift motor 118 is mounted in the chamber 80 and raises and lowers pins 120 movably disposed through the substrate support 92. The pins 120 raise and lower the substrate 90 over the surface of the substrate support 92. The substrate support 92 may include a vacuum chuck, an electrostatic chuck, or a clamp ring for securing the substrate 90 to the substrate support 92 during processing.

The substrate support 92 may be heated to heat a substrate 90 disposed thereon. For example, the substrate support 92 may be heated using an embedded heating element, such as a resistive heater, or may be heated using radiant heat, such as heating lamps disposed above the substrate support 92. A purge ring 122 may be disposed on the substrate support 92 to define a purge channel 124 which provides a purge gas to a peripheral portion of the substrate 90 to prevent deposition thereon.

A gas delivery apparatus 130 is disposed at an upper portion of the chamber body 82 to provide a gas, such as a process gas and/or a purge gas, to the chamber 80. A vacuum system 178 is in communication with a pumping channel 179 to evacuate any desired gases from the chamber 80 and to help maintain a desired pressure or a desired pressure range inside a pumping zone 166 of the chamber 80.

In one embodiment, the chambers depicted by FIGS. 1 and 2 permit the process gas and/or purge gas to enter the chamber 80 normal (i.e., 90°) with respect to the plane of the substrate 90 via the gas delivery apparatus 130. Therefore, the surface of substrate 90 is symmetrically exposed to gases that allow uniform film formation on substrates. In another embodiment, the process gas may have a circular flow pattern, such as a "vortex," "helix," or "spiral" flow passing through the expanding channel 134 towards the substrate. The circular flow may establish a more efficient purge of the expanding channel 134 due to the sweeping action of the vortex flow pattern across the inner surface of the expanding channel 134 and a laminar flow efficiently purging the surface of the chamber lid 132 and the substrate 90. The process gas includes a ruthenium-containing precursor during one pulse and includes a reducing gas in another pulse.

Chamber 80, depicted in FIG. 2, produces a more uniform film than chamber 10, depicted in FIG. 1. Also, chamber 80 employs a smaller cycle time than chamber 10, since chamber 80 takes less time to purge and less time to dose the wafer to saturation with precursor than chamber 10. The lesser dosing time is important because many of the ruthenium-containing compounds have the inherent characteristic of a low vapor pressure. The low vapor pressure correlates to less precursor saturating the carrier gas per time and temperature, therefore, more time is needed to saturate the surface of the wafer with ruthenium-containing compound (e.g., $Cp_2Ru$) than a traditional precursor with a higher vapor pressure (e.g., $TiCl_4$). Therefore, chamber 10 may dose a ruthenium-containing compound for about 1 second or less, while chamber 80 may dose the same ruthenium-containing compound for about 0.2 seconds or less.

In one embodiment, the gas delivery apparatus 130 comprises a chamber lid 132. The chamber lid 132 includes an expanding channel 134 extending from a central portion of the chamber lid 132 and a bottom surface 160 extending from the expanding channel 134 to a peripheral portion of the chamber lid 132. The bottom surface 160 is sized and shaped to substantially cover a substrate 90 disposed on the substrate support 92. The expanding channel 134 has gas inlets 136A, 136B to provide gas flows from two similar pairs of valves 142A/152A, 142B/152B, which. may be provided together and/or separately.

In one configuration, valve 142A and valve 142B are coupled to separate reactant gas sources but are preferably coupled to the same purge gas source. For example, valve 142A is coupled to reactant gas source 138 and valve 142B is coupled to reactant gas source 139, and both valves 142A, 142B are coupled to purge gas source 140. Each valve 142A, 142B includes a delivery line 143A, 143B having a valve seat assembly 144A, 144B and each valves 152A. 152B includes a purge line 145A, 145B having a valve seat assembly 146A, 146B. The delivery line 143A, 143B is in communication with the reactant gas source 138, 139 and is in communication with the gas inlet 136A, 136B of the expanding channel 134. The valve seat assembly 144A, 144B of the delivery line 143A, 143B controls the flow of the reactant gas from the reactant gas source 138, 139 to the expanding channel 134. The purge line 145A, 145B is in communication with the purge gas source 140 and intersects the delivery lines 143A. 143B downstream of the valve seat assembly 144A, 144B of the valves 142A, 142B. The valve seat assembly 146A, 146B of the purge line 145A, 145B controls the flow of the purge gas from the purge gas source 140 to the delivery line 143A, 143B. If a carrier gas is used to deliver reactant gases from the reactant gas source 138, 139, preferably the same gas is used as a carrier gas and a purge gas (i.e., an argon gas used as a carrier gas and a purge gas).

Each valve seat assembly 144A, 144B, 146A, 146B may comprise a diaphragm and a valve seat. The diaphragm may be biased open or closed and may be actuated closed or open respectively. The diaphragms may be pneumatically actuated or may be electrically actuated. Examples of pneumatically actuated valves include pneumatically actuated valves available from Fujiken and Veriflow. Examples of electrically actuated valves include electrically actuated valves available from Fujiken. Programmable logic controllers 148A, 148B may be coupled to the valves 142A, 142B to control actuation of the diaphragms of the valve seat assemblies 144A, 144B, 146A, 146B of the valves 142A, 142B. Pneumatically actuated valves may provide pulses of gases in time periods as low as about 0.020 seconds. Electrically actuated valves may provide pulses of gases in time periods as low as about 0.005 seconds. An electrically actuated valve typically requires the use of a driver coupled between the valve and the programmable logic controller.

Each valve 142A, 142B may be a zero dead volume valve to enable flushing of a reactant gas from the delivery line 143A, 143B when the valve seat assembly 144A, 144B of the valve is closed. For example, the purge line 145A, 145B may be positioned adjacent the valve seat assembly 144A, 144B of the delivery line 143A, 143B. When the valve seat assembly 144A, 144B is closed, the purge line 145A, 145B may provide a purge gas to flush the delivery line 143A, 143B. In the embodiment shown, the purge line 145A, 145B is positioned slightly spaced from the valve seat assembly 144A, 144B of the delivery line 143A, 143B so that a purge gas is not directly delivered into the valve seat assembly 144A, 144B when open. A zero dead volume valve as used herein is defined as a valve which has negligible dead volume (i.e., not necessary zero dead volume).

Each valve pair 142A/152A, 142B/152B may be adapted to provide a combined gas flow and/or separate gas flows of the reactant gas 138, 139 and the purge gas 140. In reference to valve pair 142A/152A, one example of a combined gas flow of the reactant gas 138 and the purge gas 140 provided by valve 142A comprises a continuous flow of a purge gas from the purge gas source 140 through purge line 145A and pulses of a reactant gas from the reactant gas source 138 through delivery line 143A. The continuous flow of the purge gas may be provided by leaving diaphragm of the valve seat assembly 146A of the purge line 145A open. The pulses of the reactant gas from the reactant gas source 138 may be provided by opening and closing the diaphragm of the valve seat 144A of the delivery line 143A. In reference to valve pair 142A/152A, one example of separate gas flows of the reactant gas 138 and the purge gas 140 provided by valve 142A comprises pulses of a purge gas from the purge gas source 140 through purge line 145A and pulses of a reactant gas from the reactant gas source 138 through delivery line 143A. The pulses of the purge gas may be provided by opening and closing the diaphragm of the valve seat assembly 146A of the purge line 145A open. The pulses of the reactant gas from the reactant gas source 138 may be provided by opening and closing the diaphragm valve seat 144A of the delivery line 143A.

The delivery lines 143A, 143B of the valves 142A, 142B may be coupled to the gas inlets 136A, 136B through gas conduits 150A, 150B. The gas conduits 150A, 150B may be integrated or may be separate from the valves 142A, 142B. In one aspect, the valves 142A, 142B are coupled in close proximity to the expanding channel 134 to reduce any unnecessary volume of the delivery line 143A, 143B and the gas conduits 150A, 150B between the valves 142A, 142B and the gas inlets 136A, 136B.

In FIG. 2, the expanding channel 134 comprises a channel which has an inner diameter which increases from an upper portion 137 of cap 172 to a lower portion 135 of the expanding channel 134 adjacent the bottom surface 160 of the chamber lid 132.

In one specific embodiment, the inner diameter of the expanding channel 134 for a chamber adapted to process 200 mm diameter substrates is between about 0.2 inches (0.51 cm) and about 1.0 inches (2.54 cm), more preferably between about 0.3 inches (0.76 cm) and about 0.9 inches (2.29 cm) and more preferably between about 0.3 inches (0.76 cm) and about 0.5 inches (1.27 cm) at the upper portion 137 of the expanding channel 134 and between about 0.5 inches (1.27 cm) and about 3.0 inches (7.62 cm), preferably between about 0.75 inches (1.91 cm) and about 2.5 inches (6.35 cm) and more preferably between about 1.1 inches (2.79 cm) and about 2.0 inches (5.08 cm) at the lower portion 135 of the expanding channel 134.

In another specific embodiment, the inner diameter of the expanding channel 134 for a chamber adapted to process 300 mm diameter substrates is between about 0.2 inches (0.51 cm) and about 1.0 inches (2.54 cm), more preferably between about 0.3 inches (0.76 cm) and about 0.9 inches (2.29 cm) and more preferably between about 0.3 inches (0.76 cm) and about 0.5 inches (1.27 cm) at the upper portion 137 of the expanding channel 134 and between about 0.5 inches (1.27 cm) and about 3.0 inches (7.62 cm), preferably between about 0.75 inches (1.91 cm) and about 2.5 inches (6.35 cm) and more preferably between about 1.2 inches (3.05 cm) and about 2.2 inches (5.59 cm) at the lower portion 135 of the expanding channel 134 for a 300 mm substrate. In general, the above dimension apply to an expanding channel adapted to provide a total gas flow of between about 500 sccm and about 3,000 sccm.

In other specific embodiments, the dimension may be altered to accommodate a certain gas flow therethrough. In general, a larger gas flow will require a larger diameter expanding channel. In one embodiment, the expanding channel 134 may be shaped as a truncated cone (including shapes resembling a truncated cone). Whether a gas is provided toward the walls of the expanding channel 134 or directly downward towards the substrate, the velocity of the gas flow decreases as the gas flow travels through the expanding channel 134 due to the expansion of the gas. The reduction of the velocity of the gas flow helps reduce the likelihood the gas flow will blow off reactants absorbed on the surface of the substrate 90.

Not wishing to be bound by theory, it is believed that the diameter of the expanding channel 134, which is gradually increasing from the upper portion 137 to the lower portion 135 of the expanding channel, allows less of an adiabatic expansion of a gas through the expanding channel 134 which helps to control the temperature of the gas. For instance, a sudden adiabatic expansion of a gas delivered through the gas inlet 136A, 136B into the expanding channel 134 may result in a drop in the temperature of the gas which may cause condensation of the gas and formation of particles. On the other hand, a gradually expanding channel 134 according to embodiments of the present invention is believed to provide less of an adiabatic expansion of a gas. Therefore, more heat may be transferred to or from the gas, and, thus, the temperature of the gas may be more easily controlled by controlling the surrounding temperature of the gas (i.e., controlling the temperature of the chamber lid 132). The gradually expanding channel may comprise one or more tapered inner surfaces, such as a tapered straight surface, a concave surface, a convex surface, or combinations thereof or may comprise sections of one or more tapered inner surfaces (i.e., a portion tapered, such as bottom surface 160 and a portion non-tapered such as choke 162).

In one embodiment, the gas inlets 136A, 136B are located adjacent the upper portion 137 of the expanding channel 134. In other embodiments, one or more gas inlets may be located along the length of the expanding channel 134 between the upper portion 137 and the lower portion 135.

In FIG. 2, a control unit 180, such as a programmed personal computer, work station computer, or the like, may be coupled to the chamber 80 to control processing conditions. For example, the control unit 180 may be configured to control flow of various process gases and purge gases from gas sources 138, 139, 140 through the valves 142A, 142B during different stages of a substrate process sequence. Illustratively, the control unit 180 comprises a central processing unit (CPU) 182, support circuitry 184, and memory 186 containing associated control software 183.

The control unit 180 may be one of any form of general purpose computer processor that can be used in an industrial setting for controlling various chambers and sub-processors. The CPU 182 may use any suitable memory 186, such as random access memory, read only memory, floppy disk drive, compact disc drive, hard disk, or any other form of digital storage, local or remote. Various support circuits may be coupled to the CPU 182 for supporting the chamber 80. The control unit 180 may be coupled to another controller that is located adjacent individual chamber components, such as the programmable logic controllers 148A, 148B of the valves 142A, 142B. Bi-directional communications between the control unit 180 and various other components of the chamber 80 are handled through numerous signal cables collectively referred to as signal buses 188, some of which are illustrated in FIG. 2. In addition to control of process gases and purge gases from gas sources 138, 139, 140 and from the programmable logic controllers 148A, 148B of the valves 142A, 142B, 152A. 152B the control unit 180 may be configured to be responsible for automated control of other activities used in wafer processing—such as wafer transport, temperature control, chamber evacuation, among other activities, some of which are described elsewhere herein.

Noble Metal Layer Formation

A method of noble metal layer formation for high aspect ratio interconnect features is described. The noble metal layer is deposited using a cyclical deposition process. The cyclical deposition process comprises alternately adsorbing a noble metal-containing precursor and a reducing gas on a substrate structure. The noble metal-containing precursor and the reducing gas undergo a reaction to form the noble metal layer on the substrate. Suitable noble metals may include for example ruthenium, palladium, platinum, cobalt, nickel and rhodium, among others, preferably ruthenium. The ruthenium layer has a thickness less than 500 Å, preferably from about 10 Å to about 100 Å and most preferably about 30 Å.

Figure 3:
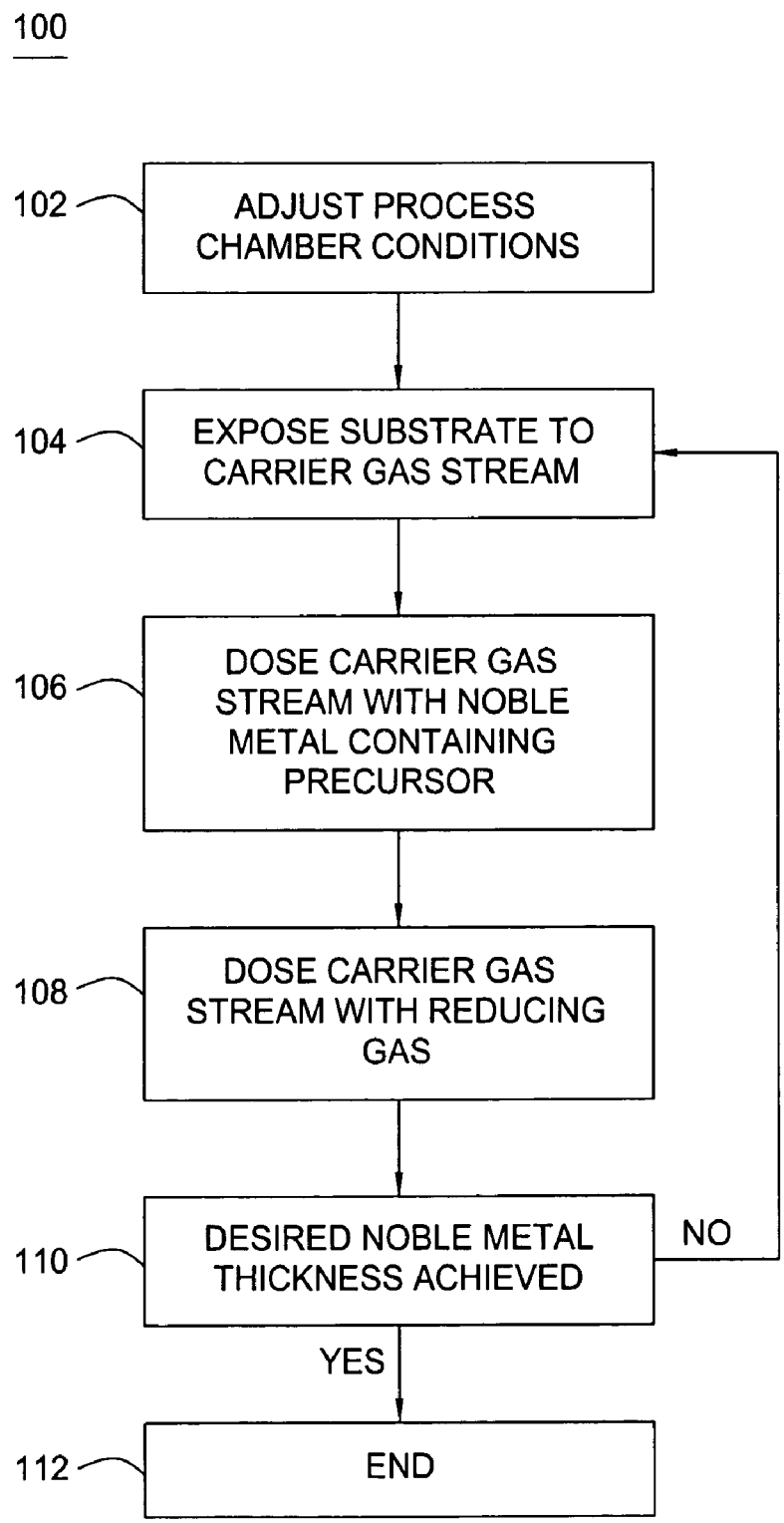
FIG. 3 illustrates a process sequence for noble metal layer formation using cyclical deposition techniques according to one embodiment described herein.

FIG. 3 illustrates a process sequence 100 detailing the various steps used for the deposition of the silicon layer. These steps may be performed in a process chamber similar to that described above with reference to FIGS. 1 and 2. As shown in step 102, a substrate is provided to the process chamber. The substrate may be for example, a silicon substrate having an interconnect pattern defined in one or more dielectric material layers formed thereon. The process chamber conditions such as, for example, the temperature and pressure are adjusted to enhance the adsorption of the process gases on the substrate so as to facilitate the reaction of the noble metal-containing precursor (e.g., ruthenium metallocene) and the reducing gas. In general, for noble metal layer deposition, the substrate should be maintained at a temperature less than about 500° C., preferably in a range from about 200° C. to about 400° C., more preferably at about 350° C. The process chamber pressure is maintained in a range from about 0.1 Torr to about 80 Torr, preferably from about 1 Torr to about 10 Torr. The noble metal-containing precursor may be provided at a flow rate between about 0.01 sccm to about 20 sccm, preferably from about 0.1 sccm to about 5 sccm, more preferably between about 0.1 sccm to about 1 sccm. The reducing gas may be provided at a flow rate between about 1 sccm to about 100 sccm, preferably between about 10 sccm to about 50 sccm.

In one embodiment where a constant carrier gas flow is desired, a carrier gas stream is established within the process chamber as indicated in step 104. Carrier gases may be selected so as to also act as a purge gas for the removal of volatile reactants and/or by-products from the process chamber. Carrier or purge gases such as, for example, helium (He), argon (Ar), nitrogen ($N_2$), hydrogen ($H_2$) or combinations thereof, among others may be used. The pulse of the purge gas lasts for a predetermined time interval, such as within a range from about 0.01 seconds to about 10 seconds, preferably from about 0.07 seconds to about 2 seconds and more preferably from about 0.1 seconds to about 1 second. The carrier gas and purge gases may be provided at a flow rate between about 500 sccm to about 5,000 sccm, preferably between about 500 sccm to about 2,500 sccm for 200 mm substrates and between about 1,000 sccm to about 5,000 sccm for 300 mm substrates.

Referring to step 106, after the carrier gas stream is established within the process chamber, a pulse of a noble metal-containing precursor is added to the carrier gas stream. The term pulse as used herein refers to a dose of material injected into the process chamber or into the carrier gas stream. The pulse of the noble metal-containing precursor lasts for a predetermined time interval, such as, within a range from about 0.01 seconds to about 10 seconds, preferably from about 0.05 seconds to about 1.5 seconds and more preferably from about 0.1 seconds to about 1 second.

The noble metal-containing precursor may comprise, for example, noble metals such as ruthenium, palladium, platinum cobalt, nickel and rhodium, among others. Suitable ruthenium-containing precursors include:
tris(2,2,6,6-tetramethyl-3,5-heptanedionato)ruthenium;
bis(2,4-dimethylpentadienyl)ruthenium;
dicarbonyl pentadienyl ruthenium, ruthenium acetyl acetonate;
(2,4-dimethylpentadienyl)ruthenium(cyclopentadienyl);
bis(2,2,6,6-tetramethyl-3,5-heptanedionato)ruthenium(1,5-cyclooctadiene);
(2,4-dimethylpentadienyl)ruthenium(methylcyclopentadienyl);
(1,5-cyclooctadiene)ruthenium(cyclopentadienyl);
(1,5-cyclooctadiene)ruthenium(methylcyclopentadienyl);
(1,5-cyclooctadiene)ruthenium(ethylcyclopentadienyl);
(2,4-dimethylpentadienyl)ruthenium(ethylcyclopentadienyl);
(2,4-dimethylpentadienyl)ruthenium (isopropylcyclopentadienyl);
bis(N,N-dimethyl 1,3-tetramethyl diiminato)ruthenium(1,5-cyclooctadiene);
bis(N,N-dimethyl 1,3-dimethyl diiminato)ruthenium(1,5-cyclooctadiene);
bis(allyl)ruthenium(1,5-cyclooctadiene), ($\eta^6$-$C_6H_6$)ruthenium(1,3-cyclohexadiene);
bis(1,1-dimethyl-2-aminoethoxylato)ruthenium(1,5-cyclooctadiene); and
bis(1,1-dimethyl-2-aminoethylaminato)ruthenium(1,5-cyclooctadiene). Suitable palladium-containing precursors include: bis(allyl)palladium; bis(2-methylallyl)palladium; and (cyclopentadienyl)(allyl)palladium, among others. Suitable platinum-containing precursors include: dimethyl(cyclooctadiene)platinum; trimethyl(cyclopentadienyl)platinum; trimethyl(methylcyclopentadienyl)platinum; cyclopentadienyl(allyl)platinum; methyl(carbonyl) cyclopentadienylplatinum; trimethyl(acetylacetonato) platinum and bis(acetylacetonato)platinum, among others. Suitable cobalt-containing precursors include: bis (cyclopentadienyl)cobalt; (cyclopentadienyl)(cyclohexadienyl)cobalt; cyclopentadienyl(1,3-hexadienyl)cobalt; (cyclobutadienyl)(cyclopentadienyl)cobalt; bis(methylcyclopentadienyl)cobalt; (cyclopentadienyl)(5-methylcyclopentadienyl)cobalt; and bis(ethylene) (pentamethylcyclopentadienyl)cobalt, among others. A suitable nickel-containing precursor includes bis (methylcyclopentadienyl) nickel, among others. Suitable rhodium-containing precursors include: bis(carbonyl)(cyclopentadienyl)rhodium; bis(propylene)rhodium; bis(carbonyl)(ethylcyclopentadienyl)rhodium; and bis(carbonyl)(methylcyclopentadienyl)rhodium and among others.

The time interval for the pulse of the noble metal-containing precursor is variable depending upon a number of factors such as, for example, the volume capacity of the process chamber employed, the vacuum system coupled thereto and the volatility/reactivity of the reactants used. For example, (1) a large-volume process chamber may lead to a longer time to stabilize the process conditions such as, for example, carrier/purge gas flow and temperature, requiring a longer pulse time; (2) a lower flow rate for the process gas may also lead to a longer time to stabilize the process conditions requiring a longer pulse time; and (3) a lower chamber pressure means that the process gas is evacuated from the process chamber more quickly requiring a longer pulse time. In general, the process conditions are advantageously selected so that a pulse of the noble metal-containing precursor provides a sufficient amount of precursor so that at least a monolayer of the noble metal-containing precursor is adsorbed on the substrate. Thereafter, excess noble metal-containing precursor remaining in the chamber may be removed from the process chamber by the constant carrier gas stream in combination with the vacuum system.

In step 108, after the excess noble metal-containing precursor has been flushed from the process chamber by the carrier gas stream, a pulse of a reducing gas is added to the carrier gas stream. The pulse of the reducing gas also lasts for a predetermined time interval. In general, the time interval for the pulse of the reducing gas should be long enough for adsorption of at least a monolayer of the reducing gas on the noble metal-containing precursor. The pulse of reducing gas lasts for a predetermined time interval, such as within a range from about 0.01 seconds to about 10 seconds, preferably from about 0.1 seconds to about 2 seconds and more preferably from about 0.1 seconds to about 1 second. Thereafter, excess reducing gas is flushed from the process chamber by the carrier gas stream. Suitable reducing gases may include, for example, hydrogen (e.g., $H_2$ or atomic-H), ammonia ($NH_3$), silane ($SiH_4$), disilane ($Si_2H_6$), trisilane ($Si_3H_8$), tetrasilane ($Si_4H_{10}$), dimethylsilane ($SiC_2H_8$), methyl silan ($SiCH_6$), ethylsilane ($SiC_2H_8$), chlorosilane ($ClSiH_3$), dichlorosilane ($Cl_2SiH_2$), hexachlorodisilane ($Si_2Cl_6$), borane, diborane, triborane, tetraborane, pentaborane, triethylborane or combinations thereof, among others.

Steps 104 through 108 comprise one embodiment of a deposition cycle for a noble metal layer. For such an embodiment, a constant flow of carrier gas is provided to the process chamber modulated by alternating periods of pulsing and non-pulsing where the periods of pulsing alternate between the noble metal-containing precursor and the reducing gas along with the carrier gas stream, while the periods of non-pulsing include only the carrier gas stream.

The time interval for each of the pulses of the noble metal-containing precursor and the reducing gas may have the same duration. That is, the duration of the pulse of the noble metal-containing precursor may be identical to the duration of the pulse of the reducing gas. For such an embodiment, a time interval ($T_1$) for the pulse of the noble metal-containing precursor is equal to a time interval ($T_2$) for the pulse of the reducing gas.

Alternatively, the time interval for each of the pulses of the noble metal-containing precursor and the reducing gas may have different durations. That is, the duration of the pulse of the noble metal-containing precursor may be shorter or longer than the duration of the pulse of the reducing gas. For such an embodiment, a time interval ($T_1$) for the pulse of the noble metal-containing precursor is different than the time interval ($T_2$) for the pulse of the reducing gas.

In addition, the periods of non-pulsing between each of the pulses of the noble metal-containing precursor and the reducing gas may have the same duration. That is, the duration of the period of non-pulsing between each pulse of the noble metal-containing precursor and each pulse of the reducing gas is identical. For such an embodiment, a time interval ($T_3$) of non-pulsing between the pulse of the noble metal-containing precursor and the pulse of the reducing gas is equal to a time interval ($T_4$) of non-pulsing between the pulse of the reducing gas and the pulse of the noble metal-containing precursor. During the time periods of non-pulsing only the constant carrier gas stream is provided to the process chamber.

Alternatively, the periods of non-pulsing between each of the pulses of the noble metal-containing precursor and the reducing gas may have different duration. That is, the duration of the period of non-pulsing between each pulse of the noble metal-containing precursor and each pulse of the reducing gas may be shorter or longer than the duration of the period of non-pulsing between each pulse of the reducing gas and the noble metal-containing precursor. For such an embodiment, a time interval ($T_3$) of non-pulsing between the pulse of the noble metal-containing precursor and the pulse of the reducing gas is different from a time interval ($T_4$) of non-pulsing between the pulse of the reducing gas and the pulse of noble metal-containing precursor. During the time periods of non-pulsing only the constant carrier gas stream is provided to the process chamber.

Additionally, the time intervals for each pulse of the noble metal-containing precursor, the reducing gas and the periods of non-pulsing therebetween for each deposition cycle may have the same duration. For such an embodiment, a time interval ($T_1$) for the noble metal-containing precursor, a time interval ($T_2$) for the reducing gas, a time interval ($T_3$) of non-pulsing between the pulse of the noble metal-containing precursor and the pulse of the reducing gas and a time interval ($T_4$) of non-pulsing between the pulse of the reducing gas and the pulse of the noble metal-containing precursor each have the same value for each deposition cycle. For example, in a first deposition cycle ($C_1$), a time interval ($T_1$) for the pulse of the noble metal-containing precursor has the same duration as the time interval ($T_1$) for the pulse of the noble metal-containing precursor in subsequent deposition cycles ($C_2 \ldots C_n$). Similarly, the duration of each pulse of the reducing gas and the periods of non-pulsing between the pulse of the noble metal-containing precursor and the reducing gas in the first deposition cycle ($C_1$) is the same as the duration of each pulse of the reducing gas and the periods of non-pulsing between the pulse of the noble metal-containing precursor and the reducing gas in subsequent deposition cycles ($C_2 \ldots C_n$), respectively.

Alternatively, the time intervals for at least one pulse of the noble metal-containing precursor, the reducing gas and the periods of non-pulsing therebetween for one or more of the deposition cycles of the noble metal layer deposition process may have different durations. For such an embodiment, one or more of the time intervals ($T_1$) for the pulses of the noble metal-containing precursor, the time intervals ($T_2$) for the pulses of the reducing gas, the time intervals ($T_3$) of non-pulsing between the pulse of the noble metal-containing precursor and the reducing gas and the time intervals ($T_4$) of non-pulsing between the pulses of the reducing gas and the noble metal-containing precursor may have different values for one or more deposition cycles of the cyclical deposition process. For example, in a first deposition cycle ($C_1$), the time interval ($T_1$) for the pulse of the noble metal-containing precursor may be longer or shorter than one or more time interval ($T_1$) for the pulse of the noble metal-containing precursor in subsequent deposition cycles ($C_2 \ldots C_n$). Similarly, the durations of the pulses of the reducing gas and the periods of non-pulsing between the pulse of the noble metal-containing precursor and the reducing gas in the first deposition cycle ($C_1$) may be the same or different than the duration of each pulse of the reducing gas and the periods of non-pulsing between the pulse of the noble metal-containing precursor and the reducing gas in subsequent deposition cycles ($C_2 \ldots C_n$).

Referring to step 110, after each deposition cycle (steps 104 through 108) a thickness of the noble metal will be formed on the substrate. Depending on specific device requirements, subsequent deposition cycles may be needed to achieve a desired thickness. As such, steps 104 through 108 are repeated until the desired thickness for the noble metal layer is achieved. Thereafter, when the desired thickness for the noble metal layer is achieved the process is stopped as indicated by step 112.

Figure 4:
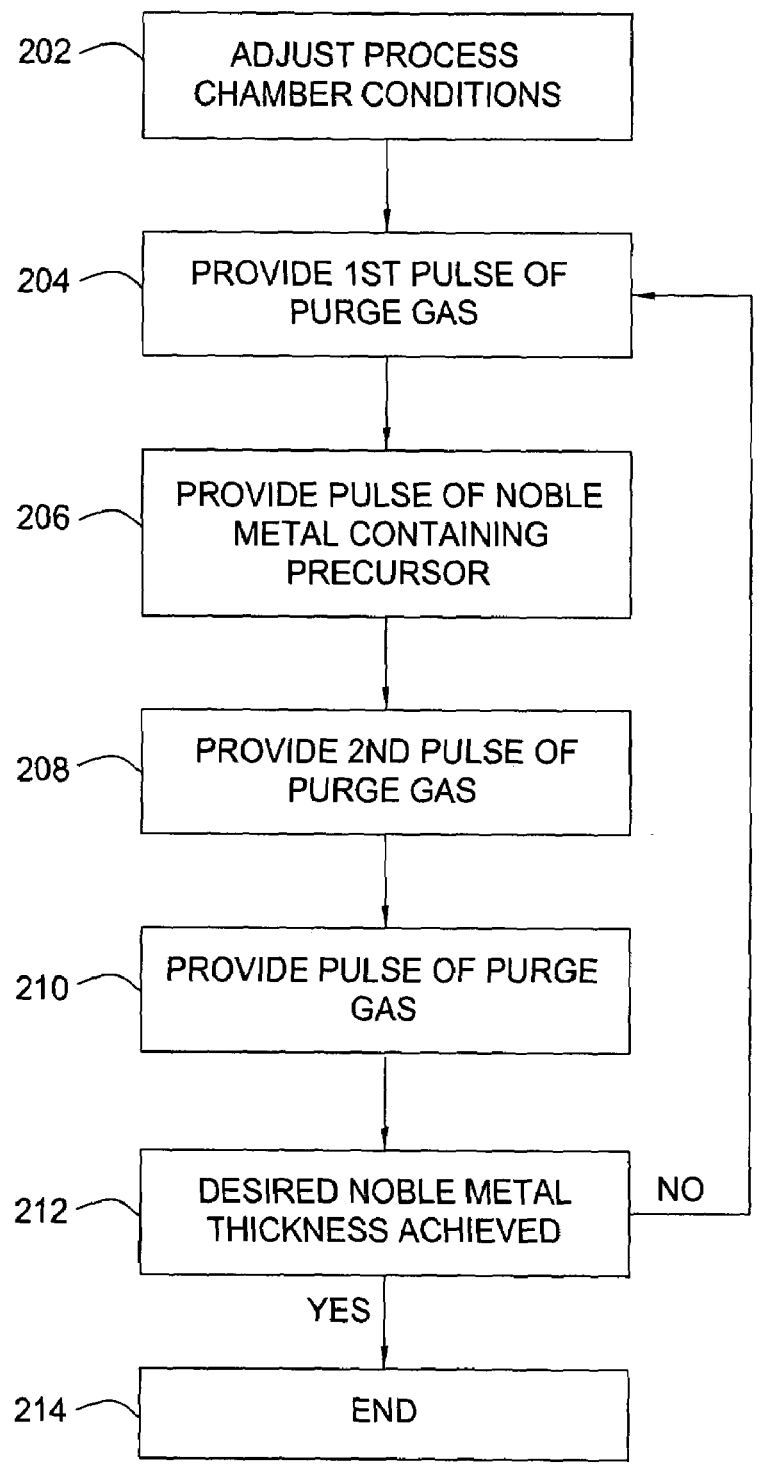
FIG. 4 illustrates a process sequence for noble metal layer formation using cyclical deposition techniques according to an alternate embodiment described herein.

In an alternate process sequence described with respect to FIG. 4, the noble metal layer deposition cycle comprises separate pulses for each of the noble metal-containing precursor, the reducing gas and a purge gas. For such an embodiment, the noble metal layer deposition sequence 200 includes providing a substrate to the process chamber (step 202), providing a first pulse of a purge gas to the process chamber (step 204), providing a pulse of a noble metal-containing precursor to the process chamber (step 206), providing a second pulse of the purge gas to the process chamber (step 208), providing a pulse of a reducing gas to the process chamber (step 210), and then repeating steps 204 through 210, or stopping the deposition process (step 214) depending on whether a desired thickness for the noble metal layer has been achieved (step 212).

The time intervals for each of the pulses of the noble metal-containing precursor, the reducing gas and the purge gas may have the same or different durations as discussed above with respect to FIG. 3. Alternatively, corresponding time intervals for one or more pulses of the noble metal-containing precursor, the reducing gas and the purge gas in one or more of the deposition cycles of the noble metal layer deposition process may have different durations.

In FIGS. 3-4, the noble metal layer deposition cycle is depicted as beginning with a pulse of the noble metal-containing precursor followed by a pulse of the reducing gas. Alternatively, the noble metal layer deposition cycle may start with a pulse of the reducing gas followed by a pulse of the noble metal-containing precursor.

One exemplary process of depositing a ruthenium layer by atomic layer deposition a substrate (e.g., 300 mm), in the process chamber 80 of FIG. 2, comprises providing pulses of a ruthenium-containing compound, such as bis(2,4-dimethylpentadienyl)ruthenium, from gas source 138 at a flow rate between about 0.01 sccm and about 5 sccm, preferably between about 0.1 sccm and about 1 sccm, through valve 142A for a pulse time of about 1.5 seconds or less, such as about 0.1 seconds or less, and as low as about 0.05 seconds or less due the smaller volume of the reaction zone 164 (as compared to chamber 8 of FIG. 1). Pulses of a reducing gas, such as diborane ($B_2H_6$), may be provided from gas source 139 at a flow rate between about 1 sccm and about 80 sccm, preferably between 10 sccm and about 50 sccm, through valve 142B for a pulse time of about 2 seconds or less, about 1 seconds or less, or about 0.1 seconds or less due to a smaller volume of the reaction zone 164. An argon purge gas at a flow rate between about 500 sccm and about 5,000 sccm, preferably, between about 1,500 sccm and about 3,500 sccm, may be continuously provided from gas source 140 through valves 142A, 142B. The time between pulses of bis(2,4-dimethylpentadienyl)ruthenium and $B_2H_6$ may be about 0.5 seconds or less, such as about 0.1 seconds or less, and as low as about 0.07 seconds or less due to the smaller volume of the reaction zone 164. It is believed to fill a reaction zone with a reactant gas and/or purge gas, pulse times as low as about 0.016 seconds are sufficient, with correspondingly shorter pulse times for a reaction zone 164 sized for smaller wafers (e.g., 200 mm). The heater temperature preferably is maintained between about 200° C. and about 400° C., preferably about 350° C. at a chamber pressure between about 1.0 and about 10 Torr, preferably about 4 Torr. This process provides a ruthenium layer in a thickness between about 0.5Å and about 1.0Å per cycle. The alternating sequence may be repeated until a desired thickness is achieved.

In one embodiment, the ruthenium layer is deposited to a sidewall coverage of about 50 Å or less. In another embodiment, the ruthenium layer is deposited to a sidewall coverage of about 20 Å or less. In still another embodiment, the ruthenium layer is deposited to a sidewall coverage of about 10 Å or less. A ruthenium layer with a thickness of about 10 Å or less is believed to be a sufficient thickness in the application as an underlayer to adhere copper deposition (i.e., seed layer) and prevent copper diffusion (i.e., barrier layer). In one aspect, a thin ruthenium under layer may be used to advantage in filling sub-micron (e.g., less than 0.15 μm) and smaller features having high aspect ratios (e.g., greater than 5 to 1). Of course, a layer having a sidewall coverage of greater than 50 Å may be used. In one embodiment, ruthenium is deposited as a seed layer. In another embodiment, ruthenium is deposited as a barrier layer.

Formation of Copper Interconnects

Figure 5A:
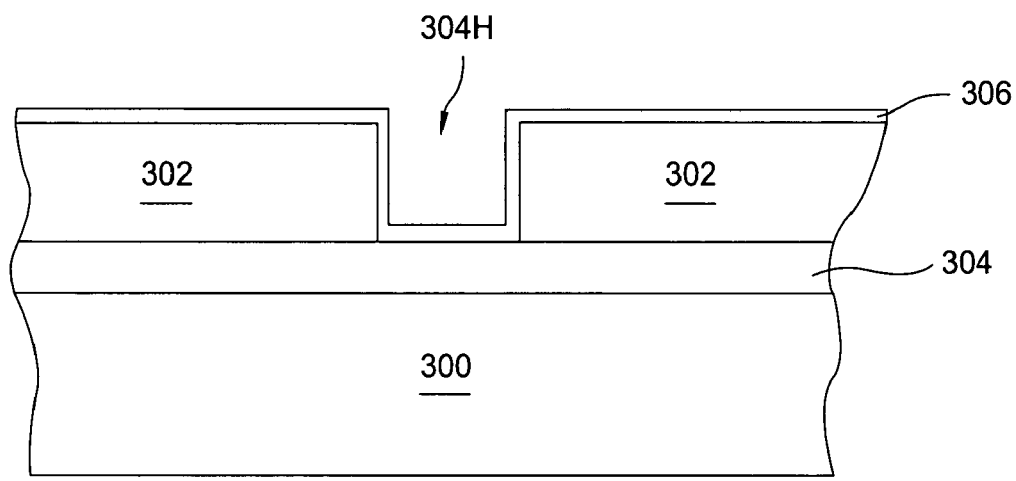
FIGS. 5A-5C illustrate schematic cross-sectibnal views of an integrated circuit fabrication sequence.
Figure 5B:
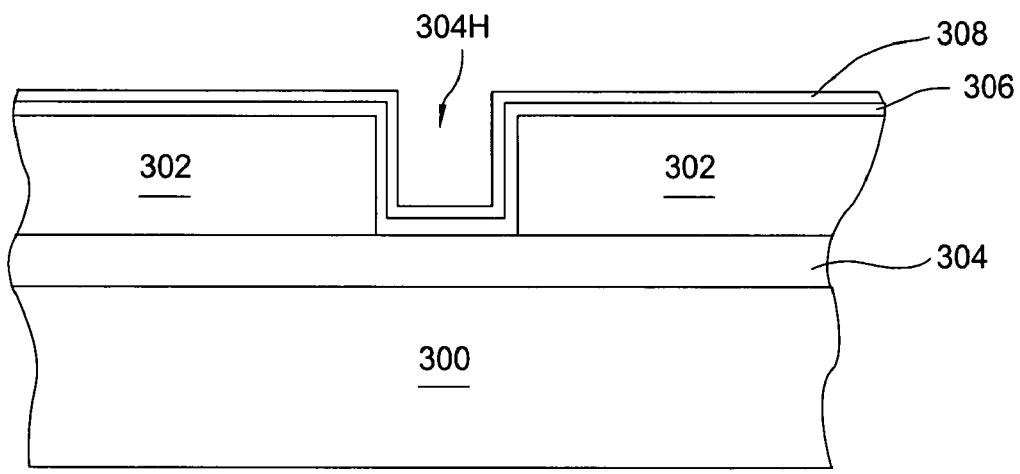
Figure 5C:
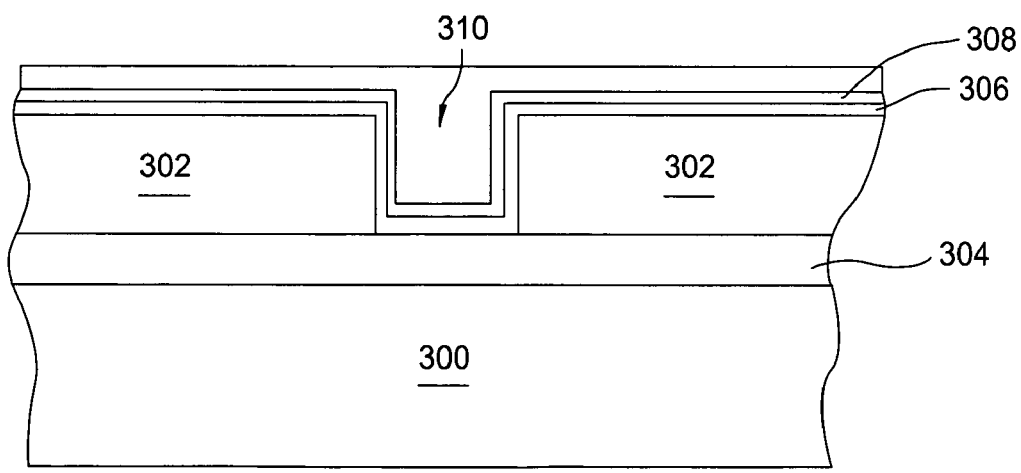

FIGS. 5A-5C illustrate cross-sectional views of a substrate at different stages of a copper interconnect fabrication sequence incorporating the noble metal layer of the present invention. FIG. 5A, for example, illustrates a cross-sectional view of a substrate 300 having metal contacts 304 and a dielectric layer 302 formed thereon. The substrate 300 may comprise a semiconductor material such as, for example, silicon, germanium, or gallium arsenide. The dielectric layer 302 may comprise an insulating material such as, for example, silicon oxide or silicon nitride, among others. The metal contacts 304 may comprise for example, copper, among others. Apertures 304H may be defined in the dielectric layer 302 to provide openings over the metal contacts 304. The apertures 304H may be defined in the dielectric layer 302 using conventional lithography and etching techniques.

A barrier layer 306 may be formed in the apertures 304H defined in the dielectric layer 302. The barrier layer 306 may include one or more refractory metal-containing layers such as, for example, titanium, titanium nitride, tantalum, tantalum nitride, tungsten and tungsten nitride, among others. The barrier layer 306 may be formed using a suitable deposition process. For example, titanium nitride may be deposited using a chemical vapor deposition (CVD) process or ALD process wherein titanium tetrachloride and ammonia are reacted.

Referring to FIG. 5B, a noble metal layer 308 (e.g., ruthenium) is formed on the barrier layer 306. The noble metal layer is formed using the cyclical deposition techniques described above with reference to FIGS. 3-4. The thickness for the noble metal layer is variable depending on the device structure to be fabricated. Typically, the thickness for the noble metal layer is less than about 100 Å, preferably between about 10 Å to about 60 Å. In one embodiment, a ruthenium layer has a thickness of about 30 Å.

Thereafter, referring to FIG. 5C, the apertures 304H may be filled with copper 310 to complete the copper interconnect. The copper 310 may be formed using one or more suitable deposition processes. In one embodiment, for example, a copper seed layer may be formed on the ruthenium layer by using a CVD process followed by deposition of bulk copper to fill the interconnects using an electrochemical plating (ECP) process. In another embodiment, a copper seed layer is deposited to the ruthenium layer via physical vapor deposition (PVD), thereafter a electroless copper plating is utilized to deposit a copper bulk fill. In another embodiment, the ruthenium layer serves as a seed layer to which a copper bulk fill is directly deposited with ECP or electroless copper plating.

Several integration sequence are conducted in order to form a ruthenium layer within the interconnect. In one embodiment, the subsequent steps follow: a) pre-clean of the substrate; b) deposition of a barrier layer (e.g., ALD of TaN); c) deposition of ruthenium by ALD; and d) deposition of copper by ECP or Cu-PVD followed by ECP. In another embodiment, the subsequent steps follow: a) deposition of a barrier layer (e.g., ALD of TaN); b) punch thru step; c) deposition of ruthenium by ALD; and d) deposition of copper by ECP or Cu-PVD followed by ECP. In another embodiment, the subsequent steps follow: a) deposition of ruthenium by ALD; b) punch thru step; c) deposition of ruthenium by ALD; and d) deposition of copper by ECP or Cu-PVD followed by ECP or Cu-PVD followed by ECP. In another embodiment, the subsequent steps follow: a) deposition of ruthenium by ALD; b) punch thru step; c) deposition of ruthenium by ALD; and d) deposition of copper by ECP. In another embodiment, the subsequent steps follow: a) pre-clean of the substrate; b) deposition of ruthenium by ALD; and c) deposition of copper by ECP or Cu-PVD followed by ECP.

The pre-clean steps include methods to clean or purify the via, such as the removal of residue at the bottom of the via (e.g., carbon) or reduction of copper oxide to copper metal. Punch thru steps include a method to remove material (e.g., barrier layer) from the bottom of the via to expose conductive layer, such as copper. Further disclosure of punch thru steps are described in more detail in the commonly assigned, U.S. Pat. No. 6,498,091, and is herein incorporated by reference. The punch thru steps is conducted in a process chamber, such as either a barrier chamber or a clean chamber. In embodiments of the invention, clean steps and punch thru steps are applied to ruthenium barrier layers. Further disclosure of overall integrated methods are described in more detail in the commonly assigned, U.S. Provisional Patent Application No. 60/478,663, entitled "Integration of ALD Tantalum Nitride for Copper Metallization", filed Jun. 13, 2003, and is herein incorporated by reference.

While foregoing is directed to the preferred embodiment of the present invention, other and further embodiments of the invention may be devised without departing from the basic scope thereof, and the scope thereof is determined by the claims that follow.

The invention claimed is:

1. A method for forming a ruthenium layer on a substrate, comprising:

positioning a substrate within a process chamber, wherein the process chamber comprises an expanding channel positioned to expose the substrate to a process gas comprising a ruthenium-containing compound or a reducing gas;

delivering the process gas from the expanding channel having a circular flow pattern; and exposing the substrate sequentially to the ruthenium-containing compound and the reducing gas during an atomic layer deposition process to form a ruthenium material on the substrate, wherein the ruthenium-containing compound is selected from the group consisting of bis(2,4-dimethylpentadienyl) ruthenium, (2,4-dimethylpentadienyl) ruthenium (cyclopentadienyl), (2,4-dimethylpentadienyl) ruthenium (methylcyclopentadienyl), (2,4-dimethylpentadienyl) ruthenium (ethylcyclopentadienyl), (2,4-dimethylpentadienyl) ruthenium (isopropylcyclopentadienyl), derivatives thereof, and combinations thereof.

2. The method of claim 1, wherein the process chamber is purged with a purge gas and a deposition cycle of the atomic layer deposition process includes sequentially delivering the ruthenium-containing compound, the purge gas, the reducing gas, and the purge gas into the process chamber.

3. The method of claim 2, wherein the purge gas is selected from the group consisting of helium, argon, hydrogen, nitrogen, and combinations thereof.

4. The method of claim 3, wherein the purge gas is pulsed into the process chamber for a duration within a range from about 0.07 seconds to about 1 second.

5. The method of claim 1, wherein the reducing gas comprises one or more reagents selected from the group consisting of hydrogen, atomic hydrogen, ammonia, silane, disilane, dimethylsilane, methylsilane, ethylsilane, chiorosilane, dichiorosilane, hexachlorodisilane, borane, diborane, triborane, tetraborane, pentaborane, triethylborane, derivatives thereof, and combinations thereof.

6. The method of claim 5, wherein the ruthenium material is formed having a thickness within a range from about 10Å to about 100 Å.

7. The method of claim 5, wherein the substrate is heated to a temperature of less than about 400° C. and the process chamber is pressurized to a pressure of less than about 80 Torr.

8. The method of claim 7, wherein the ruthenium-containing compound is pulsed into the process chamber for a duration within a range from about 0.05 seconds to about 1.5 seconds.

9. The method of claim 8, wherein the reducing gas is pulsed into the process chamber for a duration within a range from about 0.1 seconds to about 2 seconds.

10. The method of claim 1, wherein a deposition cycle of the atomic layer deposition process includes sequentially delivering the ruthenium-containing compound and the reducing gas into the carrier gas.

11. The method of claim 10, wherein the reducing gas comprises a reagent selected from the group consisting of hydrogen, atomic hydrogen, ammonia, derivatives thereof, and combinations thereof.

12. The method of claim 11, wherein the process gas comprises a carrier gas selected from the group consisting of hydrogen, nitrogen, argon, helium, and combinations thereof.

13. The method of claim 1, wherein the circular flow pattern is selected from the group consisting of a vortex pattern, a helix pattern, a spiral pattern, derivatives thereof, and combinations thereof.

14. A method for forming a ruthenium layer on a substrate, comprising:
 positioning a substrate within a process chamber comprising a lid assembly having a centralized expanding channel;
 flowing a carrier gas towards the walls of the expanding channel and down the expanding channel towards the substrate, wherein a flow rate of the carrier gas decreases as the carrier gas travels through the expanding channel;
 exposing the substrate to the carrier gas; and
 exposing the substrate sequentially to a ruthenium-containing compound and a reducing gas to form a ruthenium material on the substrate, wherein the ruthenium-containing compound and the reducing gas are sequentially pulsed into the carrier gas and the ruthenium-containing compound comprises a 2,4-dimethylpentadienyl ligand.

15. The method of claim 14, wherein the ruthenium-containing compound is selected from the group consisting of
 bis(2,4-dimethylpentadienyl) ruthenium,
 (2,4-dimethylpentadienyl) ruthenium (cyclopentadienyl),
 (2,4-dimethylpentadienyl) ruthenium (methylcyclopentadienyl),
 (2,4-dimethylpentadienyl) ruthenium (ethylcyclopentadienyl),
 (2,4-dimethylpentadienyl) ruthenium (isopropylcyclopentadienyl), derivatives thereof, and combinations thereof.

16. The method of claim 15, wherein the reducing gas comprises one or more reagents selected from the group consisting of hydrogen, atomic hydrogen, ammonia, silane, disilane, dimethylsilane, methylsilane, ethylsilane, chlorosilane, dichlorosilane, hexachlorodisilane, borane, diborane, triborane, tetraborane, pentaborane, triethylborane, derivatives thereof, and combinations thereof.

17. The method of claim 16, wherein the ruthenium material is formed having a thickness within a range from about 10Å to about 100 Å.

18. The method of claim 16, wherein the substrate is heated to a temperature of less than about 400° C. and the process chamber is pressurized to a pressure of less than about 80 Torr.

19. The method of claim 18, wherein the ruthenium-containing compound is pulsed into the carrier gas for a duration within a range from about 0.05 seconds to about 1.5 seconds.

20. The method of claim 19, wherein the reducing gas is pulsed into the carrier gas for a duration within a range from about 0.1 seconds to about 2 seconds.

21. The method of claim 14, wherein the carrier gas is selected from the group consisting of helium, argon, hydrogen, nitrogen, and combinations thereof.

22. The method of claim 14, wherein a circular flow pattern is formed as the carrier gas passes through the expanding channel.

23. The method of claim 22, wherein the reducing gas comprises a reagent selected from the group consisting of hydrogen, atomic hydrogen, ammonia, derivatives thereof, and combinations thereof.

24. The method of claim 22, wherein the circular flow pattern is selected from the group consisting of a vortex pattern, a helix pattern, a spiral pattern, derivatives thereof, and combinations thereof.

25. A method for forming a ruthenium-containing material on a substrate, comprising:
 positioning a substrate within a process chamber, wherein the process chamber comprises an expanding channel positioned to expose the substrate to a process gas having a circular flow pattern; and
 exposing the substrate to the process gas during an atomic layer deposition process cycle, comprising:
  (a) exposing the substrate to the process gas comprising a ruthenium-containing compound to form a ruthenium-containing layer thereon, wherein the ruthenium-containing compound comprises a 2,4-dimethylpentadienyl ligand
  (b) purging the process chamber with a purge gas;
  (c) exposing the substrate to the process gas comprising a reducing gas to form a ruthenium material thereon; and
  (d) purging the process chamber with the purge gas.

26. The method of claim 25, wherein the ruthenium material is deposited by repeating the atomic layer deposition process cycle of steps a-d.

27. The method of claim 26, wherein the purge gas is selected from the group consisting of helium, argon, hydrogen, nitrogen, and combinations thereof.

28. The method of claim 27, wherein the purge gas is pulsed into the process chamber for a duration within a range from about 0.07 seconds to about 1 second.

29. The method of claim 26, wherein the ruthenium-containing compound is selected from the group consisting of
 bis(2.4-dimethylpentadienyl) ruthenium,
 (2,4-dimethylpentadienyl) ruthenium (cyclopentadienyl),
 (2,4-dimethylpentadienyl) ruthenium (methylcyclopentadienyl),
 (2,4-dimethylpentadienyl) ruthenium (ethylcyclopentadienyl),
 (2,4-dimethylpentadienyl) ruthenium (isopropylcyclopentadienyl), derivatives thereof, and combinations thereof.

30. The method of claim 29, wherein the reducing gas comprises one or more reagents selected from the group consisting of hydrogen, atomic hydrogen, ammonia, silane, disilane, dimethylsilane, methylsilane, ethylsilane, chiorosilane, dichlorosilane, hexachlorodisilane, borane, diborane, triborane, tetraborane, pentaborane, triethylborane, derivatives thereof, and combinations thereof.

31. The method of claim 30, wherein steps a-d are repeated to form the ruthenium material having a thickness within a range from about 10Å to about 100 Å.

32. The method of claim 30, wherein the substrate is heated to a temperature of less than about 400° C. and the process chamber is pressurized to a pressure of less than about 80 Torr.

33. The method of claim 32, wherein the ruthenium-containing compound is pulsed into the process chamber for a duration within a range from about 0.05 seconds to about 1.5 seconds.

34. The method of claim 33, wherein the reducing gas is pulsed into the process chamber for a duration within a range from about 0.1 seconds to about 2 seconds.

35. The method of claim 25, wherein the ruthenium-containing compound is pulsed into the process gas.

36. The method of claim 35, wherein the purge gas is the process gas.

37. The method of claim 36, wherein the reducing gas comprises a reagent selected from the group consisting of hydrogen, atomic hydrogen, ammonia, derivatives thereof, and combinations thereof.

38. The method of claim 36, wherein the process gas comprises a gas selected from the group consisting of hydrogen, nitrogen, argon, helium, and combinations thereof.

39. The method of claim 38, wherein the circular flow pattern is selected from the group consisting of a vortex pattern, a helix pattern, a spiral pattern, derivatives thereof, and combinations thereof.

40. A method for forming a ruthenium layer on a substrate, comprising:
positioning a substrate on a substrate support within a process chamber;
flowing a carrier gas through an expanding channel substantially axially positioned with the substrate, wherein the carrier gas forms a circular flow pattern along the expanding channel; and
exposing the substrate to the carrier gas while pulsing a ruthenium-containing compound into the carrier gas to form a ruthenium material on the substrate.

41. The method of claim 40, wherein the carrier gas comprises a gas selected from the group consisting of hydrogen, nitrogen, argon, helium, and combinations thereof.

42. The method of claim 41, wherein the circular flow pattern is selected from the group consisting of a vortex pattern, a helix pattern, a spiral pattern, derivatives thereof, and combinations thereof.

43. The method of claim 40, wherein a reducing gas and the ruthenium-containing compound are sequentially pulsed into the carrier gas and the reducing gas comprises a reagent selected from the group consisting of hydrogen, atomic hydrogen, ammonia, silane,disilane, diborane, derivatives thereof, and combinations thereof.

44. The method of claim 40, wherein the ruthenium-containing compound and a reducing gas are sequentially pulsed into the carrier gas and the ruthenium-containing compound comprises a 2,4-dimethylpentadienyl ligand.

45. The method of claim 44, wherein the ruthenium-containing compound is selected from the group consisting of bis(2,4-dimethylpentadienyl) ruthenium, (2,4-dimethylpentadienyl) ruthenium (cyclopentadienyl), (2,4-dimethylpentadienyl) ruthenium (methylcyclopentadienyl), (2,4-dimethylpentadienyl) ruthenium (ethylcyclopentadienyl), (2,4-dimethylpentadienyl) ruthenium (isopropylcyclopentadienyl), derivatives thereof, and combinations thereof.

46. The method of claim 40, wherein the ruthenium-containing compound is selected from the group consisting of tris(2,2,6,6-tetramethyl-3,5-heptanedionato) ruthenium, bis(2,4-dimethyipentadienyl) ruthenium, dicarbonyl pentadienyl ruthenium, ruthenium acetyl acetonate, (2,4-dimethylpentadienyl) ruthenium (cyclopentadienyl), bis(2,2,6,6-tetramethyl-3,5-heptanedionato) ruthenium (1,5-cyclooctadiene), (2,4-dimethylpentadienyl) ruthenium (methylcyclopentad ienyl), (1,5-cyclooctadiene) ruthenium (cyclopentadjenyl), (1,5-cyclooctadjene) ruthenium (methylcyclopentadienyl), (1,5-cyclooctadiene) ruthenium (ethylcyclopentadienyl), (2,4-dimethylpentadienyl) ruthenium (ethylcyclopentadjenyl), (2,4-dimethylpentadjenyl) ruthenium (isopropylcyclopentadienyl), bis(N,N-dimethyl 1,3-tetramethyl diiminato) ruthenium (1,5-cyclooctadiene), bis (N,N-dimethyl 1,3-dimethyl diiminato) ruthenium (1,5-cyclooctadiene), bis(aIlyI) ruthenium (1,5-cyclooctadiene), ($\eta_6$-$C_6H_6$) ruthenium (1,3-cyclohexadiene), bis(1,1-dimethyl-2-aminoethoxylato) ruthenium (1,5-cyclooctadiene), bis(1,1-dimethyl-2-aminoethylaminato) ruthenium (1,5-cyclooctadiene), derivatives thereof, and combinations thereof.

* * * * *